United States Patent [19]
Yamamura

[11] Patent Number: 4,984,044
[45] Date of Patent: Jan. 8, 1991

[54] SOLID STATE IMAGER DEVICE
[75] Inventor: Michio Yamamura, Tokyo, Japan
[73] Assignee: Sony Corporation, Tokyo, Japan
[21] Appl. No.: 28,588
[22] Filed: Mar. 20, 1987
[30] Foreign Application Priority Data
  Mar. 25, 1986 [JP] Japan .................................. 61-66605
[51] Int. Cl.⁵ ...................... H01L 29/78; H01L 27/14; H01L 29/34
[52] U.S. Cl. ......................................... 357/24; 357/30; 357/52
[58] Field of Search .................. 357/24 LR, 24 M, 24, 357/30 D, 30 F, 30 R, 52

[56]  References Cited
  U.S. PATENT DOCUMENTS
  4,460,912  7/1984  Takeshita et al. .............. 357/24 LR
  4,527,182  7/1985  Ishihara et al. ................. 357/24 LR
  4,717,945  1/1988  Yusa et al. ...................... 357/24 LR FOREIGN PATENT DOCUMENTS
  0174133  8/1985  European Pat. Off. .
  58-42370  3/1983  Japan ............................... 357/24 LR
  2007937  5/1979  United Kingdom .

Primary Examiner—Andrew J. James
Assistant Examiner—Ngan Van Ngo
Attorney, Agent, or Firm—Hill, Van Santen, Steadman & Simpson

[57] ABSTRACT

A solid state imager device having a semiconductor substrate which includes a substrate region of a first conductivity type, a light receiving area of a second conductivity type forming a light receiving section, a charge transfer section and a low impurity concentration region arranged under and contacting with the light receiving area and between the light receiving area and the substrate region, a forward electrode formed on the semiconductor substrate through a dielectric layer, and a charge transfer control electrode formed on the dielectric layer between the light receiving section and the charge transfer section, wherein the forward electrode is supplied with a voltage for forming a charge storage layer on a boundary plane between the dielectric layer and the forward electrode, and the edge of the transfer control electrode at the side of the light receiving area substantially coincides with the edge of the light receiving area at a side facing to the charge transfer section.

5 Claims, 5 Drawing Sheets

SOLID STATE IMAGER DEVICE

BACKGROUND OF THE INVENTION

1. Field of the Invention

This invention relates generally to a solid state imager device constructed by charge transfer devices (CTD), and more particularly to a solid state imager device of this kind which has a light receiving area formed of a so-called buried channel MOS structure (the MOS structure designates a stacking structure of semiconductor layer—dielectric layer—conduction layer) to thereby form a charge storage layer on the surface thereof.

2. Description of the Prior Art

In an interline transfer CTD type solid state imager device, it can be expected to remarkably reduce a dark current caused by a current generated on the surface of the device by forming a light receiving section of a buried channel MOS structure to thereby operate the device under conditions that a pinning, i.e. a charge storage layer is formed over the surface thereof.

FIG. 1 shows a cross-sectional view of a main portion of such a solid state imager device which is mainly formed of a silicon semiconductor substrate 1 in which on a substrate forming a p-type region 2 there is formed an n-type semiconductor layer 3. On a major surface 1a of the substrate 1 at the side where the semiconductor layer 3 is provided, there are provided with a light receiving section 4, a charge transfer section 5, i.e. vertical shift register arranged at every vertical line, horizontal shift register, not shown in the drawing, and so on.

The light receiving section 4 is formed of the n-type semiconductor layer 3 and is composed of a light receiving area 6 which is sectioned by channel stop regions, not shown, which are respectively arranged in the horizontal and vertical directions. Further, an n-type overflow drain area or region 8 is arranged adjacent to the light receiving area 6 through a p-type overflow control area or region 7.

The vertical shift register section 5 is formed of an n-type charge transfer region 10 formed on a p-type well region 9 which is selectively formed on the semiconductor layer 3.

Over the major surface 1a of the substrate 1, there is also deposited a light-transmissible dielectric layer 11, e.g. $SiO_2$ or the like.

There is deposited on the dielectric layer 11 between the light receiving section 4 and the vertical shift register section, i.e. the charge transfer section 5, a transfer control electrode 13 which controls the transfer of signal charges accumulated in the light receiving section 4 to the charge transfer region 10 of the vertical shift register section 5, to thereby form a transfer control section 12. The transfer control electrode 13 is commonly formed e.g. with a portion of transfer electrodes of the vertical shift register section 5.

In a forward portion of the light receiving section 4, that is, on the dielectric layer 11 at the light receiving section 4, there is deposited a light-transmissible forward electrode 14 all over the overflow control region 7 and the overflow drain region 8.

The transfer control electrode 13 and the forward electrode 14 can be formed of e.g. a polycristalline silicon layer. The surface of the device except for the light receiving section 4 is covered with a light shielding member which is not shown in FIG. 1. Further, on the surfaces of the respective electrodes, e.g. the transfer control electrode 13 arranged below the forward electrode 14, there is coated an insulating layer 15 made of e.g. $SiO_2$ or the like to thereby electrically insulate the respective electrodes one another.

In the construction described above, a predetermined negative voltage is given to the forward electrode 14 to form a storage layer for positive charges in the light receiving area 6 at its surface, so that a buried channel is formed from the suface of the area 6 to its inside. Since the voltage actually applied to the forward electrode 14 is limited by the break down voltage and so on, the lowest potential point in the buried channel is at most several voltages. When charges that is, electrons generated by received light are accumulated in this storage layer, the thickness of a depletion layer produced below the light receiving area 6 is actually at most 2–3 $\mu m$. On the other hand, disturbance or a so-called smear in a picked up image, caused by the signal charge flowing from inside the substrate into another light receiving area 6 or the charge transfer region 10 of the vertical shift register section 5 depends on the thickness of the depletion layer below the light receiving area 6 as described above. To be specific, the smear becomes larger as the thickness of the depletion layer is thinner. In general, a depletion layer which has a thickness of only 2–3 $\mu m$ cannot sufficiently prevent smear from occurring.

Incidentally, a pinning MOS type CCD imager device which has a charge storage layer formed over the surface thereof is disclosed e.g. by a collection of papers presented at '84 National Conference of the Institute of Television Engineers of Japan, on pages 41–42.

OBJECTS AND SUMMARY OF THE INVENTION

Therefore, it is the object of the present invention to provide a solid state imager device which solves the problem of the smear due to the above-mentioned depletion layer being narrow as well as other problems associated therewith.

According to an aspect of the invention there is provided a solid state imager device comprising: a semiconductor substrate having a substrate region of a first conductivity type, a light receiving area of a second conductivity type forming a light receiving section, a charge transfer section and a low impurity concentration region arranged under and contacting with the light receiving area and between the light receiving area and the substrate region; a forward electrode formed on the semiconductor substrate through a dielectric layer; and a charge transfer control electrode formed on the dielectric layer between the light receiving section and the charge transfer section, wherein the forward electrode is supplied with a voltage for forming a charge storage layer on a boundary plane between the dielectric layer and the forward electrode, and an edge of the transfer control electrode at a side of the light receiving area substantially coincides with an edge of the light receiving area at a side facing to the charge transfer section.

The above and other objects, features, and advantages of the present invention will become apparent from the following detailed description of the preferred embodiment taken in conjunction with the accompanying drawings, throughout which like reference numerals designates like elements and parts.

DESCRIPTION OF THE PREFERRED EMBODIMENTS

Now, an embodiment of a solid state imager device according to the present invention will hereinafter be described with reference to FIG. 2.

Figure 1:
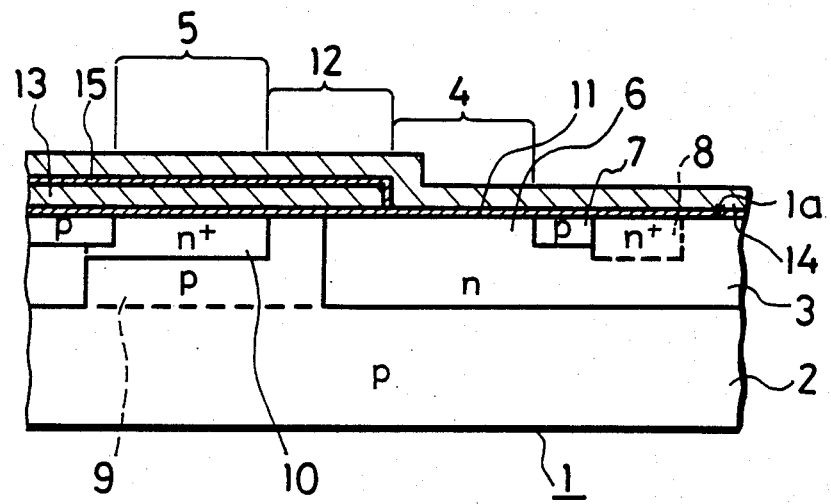
FIG. 1 is an enlarged cross-sectional view showing a main portion of a prior art device.
Figure 2:
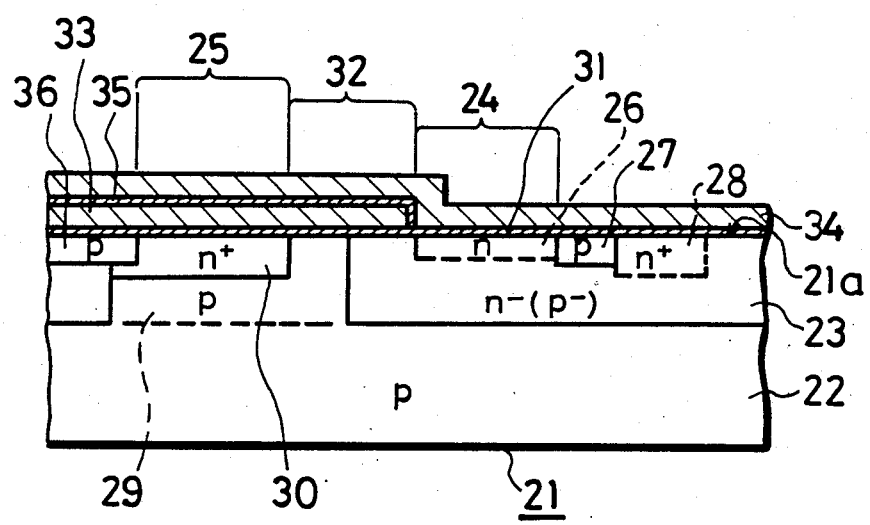
FIG. 2 is an enlarged cross-sectional view showing a main portion of a device according to the present invention.

FIG. 2 is an enlarged cross-sectional view showing a main portion of a solid state imager device according to the invention.

As is clear from FIG. 2, the solid state imager device is formed mainly of a semiconductor substrate 21 which has a first conductivity type, e.g. p-type substrate region 22 on which through a low impurity concentration region 23 and facing its major surface 21a at its side opposite to the side where the substrate region 22 is formed, there is formed light receiving section 24 which is composed of a plurality of second conductivity type, e.g. n-type light receiving areas 26 arranged in the vertical and horizontal directions. Then, a charge transfer section 25, that is, a vertical shift register is arranged along the light receiving areas 26 which are arranged e.g. along a vertical common line. The charge transfer section 25 is also constructed by forming a second conductivity type charge transfer region 30 on a well region 29 of the first conductivity type.

On the major surface 21a of the substrate 21, there is deposited a light-transmissible dielectric layer 31. A transfer control electrode 33 for controlling the transfer of the signal charge accumulated in the light receiving section 24 to the vertical shift register section 25 is deposited on the dielectric layer 31 between the light receiving section 24 and the charge transfer section, that is, the vertical shift register section 25 to thereby form a transfer control section 32. The transfer control electrode 33 can be commonly formed with e.g. a portion of the transfer electrode of the vertical shift register section 25.

Further, wity an overflow control region 27 of the first conductivity type which surrounds the respective light receiving areas 26, there is formed an overflow drain region 28 of the second conductivity type.

In a forward portion of the light receiving section 24, that is, on the dielectric layer 31 above the light receiving section 24, a light transmissible forward electrode 34 is deposited all over the overflow control region 27 and the overflow drain region 28.

The transfer control electrode 33 and the forward electrode 34 can be formed of e.g. a polycristalline silicon layer. The surface of the device except for the light receiving section 24 is covered with a light shielding member, not shown. Further, on the surfaces of the respective electrodes, e.g. the transfer control electrode 33 arranged below the forward electrode 34, there is coated an insulating layer 35 made of e.g. $SiO_2$ or the like to thereby electrically insulate the respective electrodes from one another.

Reference numeral 36 designates a channel stop region formed on the major surface 21a of the substrate 21 between, surrounding sections which are to be separated from each other, e.g. the vertical shift register section 25, the light receiving section 24, and so on.

Figure 3:
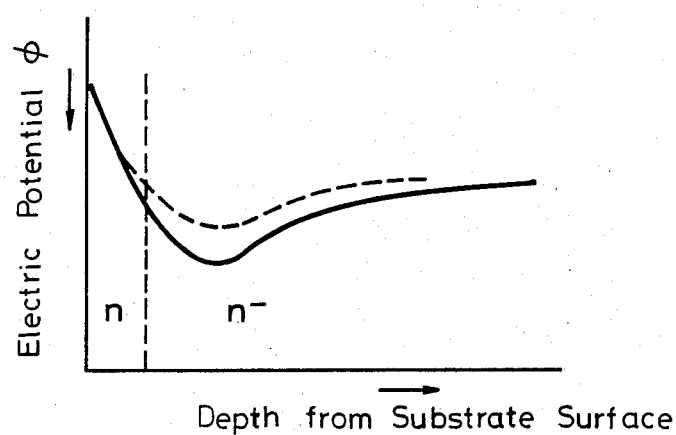
FIGS. 3 and 4 are graphes of potential distribution for explaining the operation of the device according to the present invention shown in FIG. 2.

In the above-mentioned solid state imager device, the forward electrode 34 is supplied with a predetermined negative voltage to form a storage layer for the positive charges on the surface of the light receiving area 26, so that a buried channel is formed from the surface of the light receiving area 6 to the inside thereof. Since the low impurity concentration region 23 is arranged below the light receiving area 26, the potential distribution in the thickness direction across the light receiving area 26, namely, the depletion layer is extended as indicated by a solid line curve in FIG. 3. Under this condition, when light is incident on the light receiving area 26 and thereby the carriers, that is, electrons in the illustrated example in FIG. 2, are generated, the electrons are accumulated in a valley of the potential so that the potential distribution changes as indicated by a broken line curve in FIG. 3, wherein the depletion layer is reduced to some degree. However, due to the existence of the low impurity concentration region 23, the depletion layer is left in a relatively extended condition. By virtue of the effect described above, it is possible to substantially reduce the possiblity of charges leaking from the light receiving area 26 to the substrate 21 which will inhibit charges from flowing into other light receiving areas or into the charge transfer section 25, so that the smear can be effectively avoided.

Further, as described above, according to the present invention, the low impurity concentration region 23 is arranged under the light receiving area 26 or surrounding the same. If the light receiving area 26 is so as to extend partially below the transfer control electrode 33 of the transfer control section 32, upon a read-out operation of the charges, that is, when the charges accumulated in the light receiving area 26 are transferred to the shift register section 25, in other words, when the positive voltage is applied to the transfer control electrode 33, the potential in the part of the light receiving area which extends to the part below the transfer control electrode 33 will be different than that in the part below the electrode 33. As a result, a valley of potential which interferes with the charge transfer from the light receiving area 26 to the charge transfer region 30 occurs. However, according to the present invention, since the end of the edge of the light receiving area 26 is made to be coincident with that of the transfer control electrode 33, the above-mentioned interference can be avoided.

Figure 4:
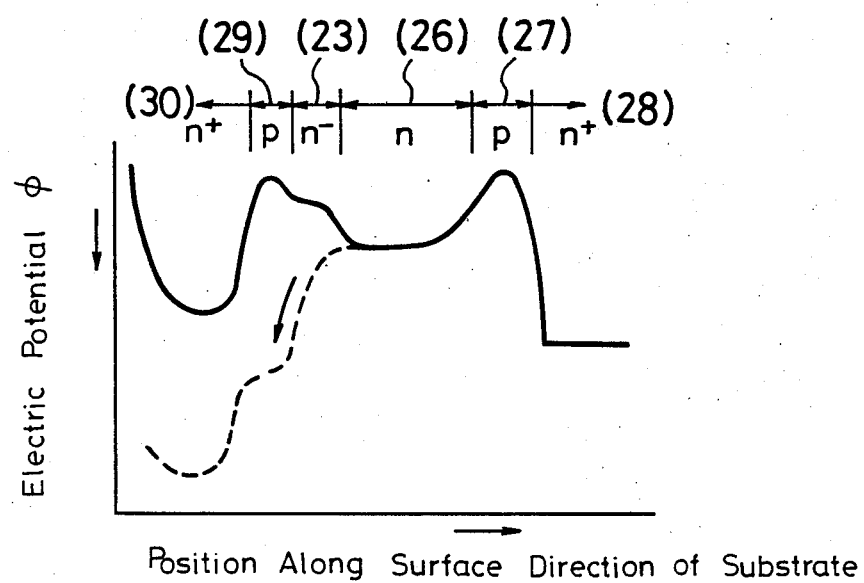

FIG. 4 is a graph showing the distribution of potential of signal charges along the surface direction of a portion of the substrate 21 including the light receiving section 24 and the vertical shift register section 25 in which a solid line curve in the graph represents the light receiving state or the case where a voltage, e.g. 0 V is applied to the transfer control electrode 33 to accumulate signal charges generated by receiving light, e.g. electrons in the light receiving area 26 while a broken line curve in the graph represents the case where a voltage, e.g. 10 V is applied to the electrode 33 to transfer the signal charges from the light receiving area 26 to the charge transfer region 30. Thus, there can be formed in the transfer control section a step-shaped mono-directional gradient toward the charge transfer region 30, without any barrier or valley, so that the signal charges can be effectively transferred.

Next, the steps of the manufacturing procedure for the solid state imager device shown in FIG. 2 will be explained with reference to FIGS. 5A through 5F.

Figure 5A:
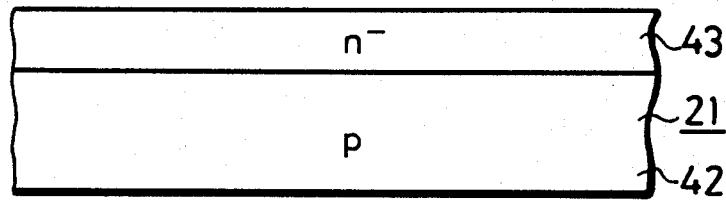
FIGS. 5A through 5F are diagrams showing a manufacturing process of the device of the present invention shown in FIG. 2.

First, referring to FIG. 5A, a p-type silicon substrate 42 forming the substrate region 22 is prepared, thereon or on its surface, a semiconductor layer 43 having a lower impurity concentration than the light receiving area 26 which is to be formed later, is formed by a vapor growth technique or by introducing an n-type impurity all over a major surface of the substrate 42 by an ion implantation or diffusion technique. Thus, the semiconductor substrate 21 comprising the substrate 42 and the semiconductor layer 43 is formed.

Figure 5B:
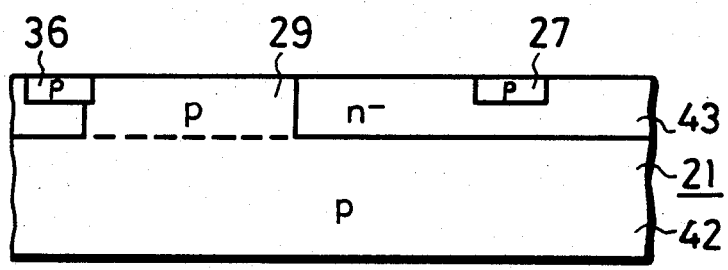

Next, as shown in FIG. 5B, the p-type well region 29 is formed by selectively implanting a p-type impurity to a relatively large depth, e.g. to a depth reaching the substrate 42, into the semiconductor layer 43 by the ion implantation or diffusion technique. In the same manner, a p-type impurity is implanted selectively into the semiconductor layer 43 by the ion implantation, diffusion technique or the like to form the flow control region 27 and the channel stop region 36.

Figure 5C:
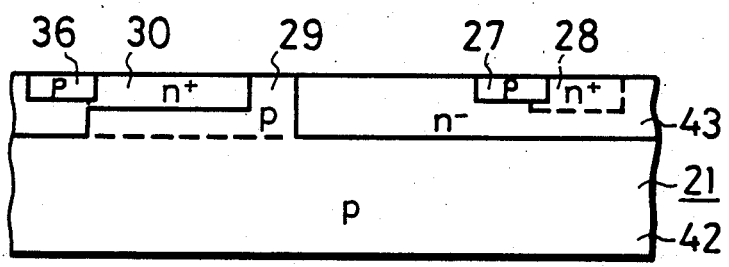

As shown in FIG. 5C, an n-type impurity is implanted selectively into the well region 29 outside the overflow control region 27 by the ion implantation, diffusion technique or the like to form the overflow drain region 28 and a charge transfer section, that is, the charge transfer region 30 of the vertical shift register section 25.

Figure 5D:
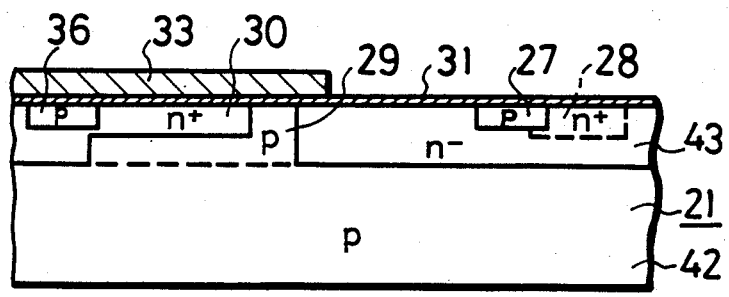

As shown in FIG. 5D, over the major surface 21a of the semiconductor substrate 21 opposite to the surface having the substrate 42, the dielectric layer 31 made of, e.g. SiO$_2$ or the like is deposited by a surface thermal oxidation technique. Then, on the top thereof, e.g. a polycrystalline silicon layer having a low resistivity is formed by a chemical vapor deposition (CVD) technique or the like and thereafter this layer is photoetched to have a predetermined pattern to thereby form the transfer control electrode 33.

Figure 5E:
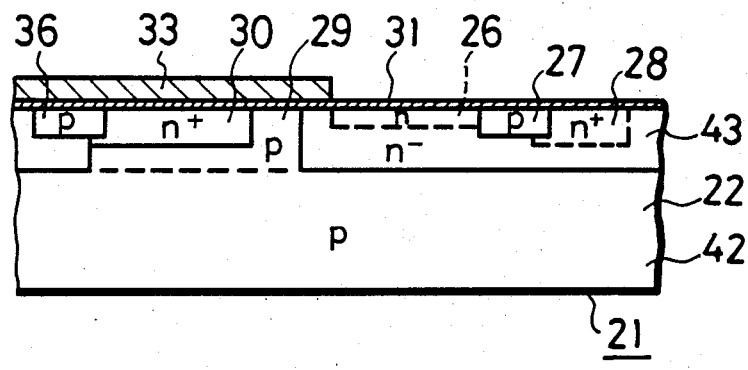

Then, as shown in FIG. 5E, while the transfer control electrode 33 is used at least as a mask, an n-type impurity, e.g. phosphorus P is implanted to form the light receiving area 26.

Figure 5F:
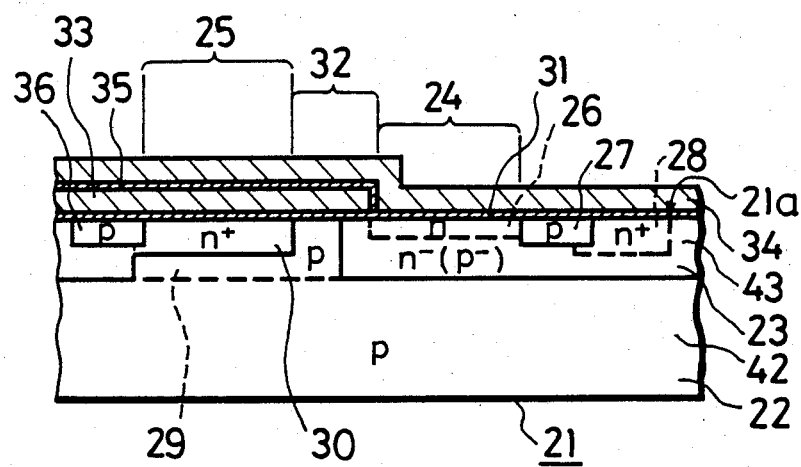

Next, as shown in FIG. 5F, over the surface of the electrode 33 the insulating layer 35 is formed by, e.g. thermally oxidizing the same. Further, on the insulating layer 35, the forward electrode 34 of a polycrystalline silicon layer is deposited in the same manner as the electrode 33.

By the construction described above, it is possible to obtain the same imager device as that shown in FIG. 2 in which the low impurity concentration region 23 is formed in a portion of the semiconductor layer 43. Actually, other sections such as the horizontal shift register section, the output circuit and so on which construct the interline transfer system imager device, are formed on the semiconductor substrate 21 in the course of the procedure described above.

Incidentally, in the example of the present invention shown in FIGS. 2 and 5, the low impurity concentration region 23 or the semiconductor layer 43 has the n-type conductivity which is the same as that of the light receiving area 26, however, it may have the opposite conductivity or p-type conductivity in a certain case.

Further, in the example of the invention shown in FIGS. 2 and 5, the charge transfer region 30 is formed on the well region 29 in such a manner that it is located in the inside of the well region 29, that is, a portion of the well region 29 faces to the surface of the substrate 21 between the vertical shift register section 25 and the light receiving section 24. In this case, by virtue of the well region 29, it is possible to prevent the signal charge which flows into the inside of the substrate for some reasons from entering into the charge transfer region 30 of the vertical shift register section 25 and subsequently to suppress the occurrence of flares. Also due to the fact that a part of the well region 29 faces to the surface of the substrate 21 and as is understood from the graph of FIG. 4 which shows the potential distribution, when the imager device receives light, a high potential barrier can be formed between the light receiving area 26 and the charge transfer region 30 so that unnecessary charges can be inhibited from flowing into the charge transfer region 30.

Figure 6:
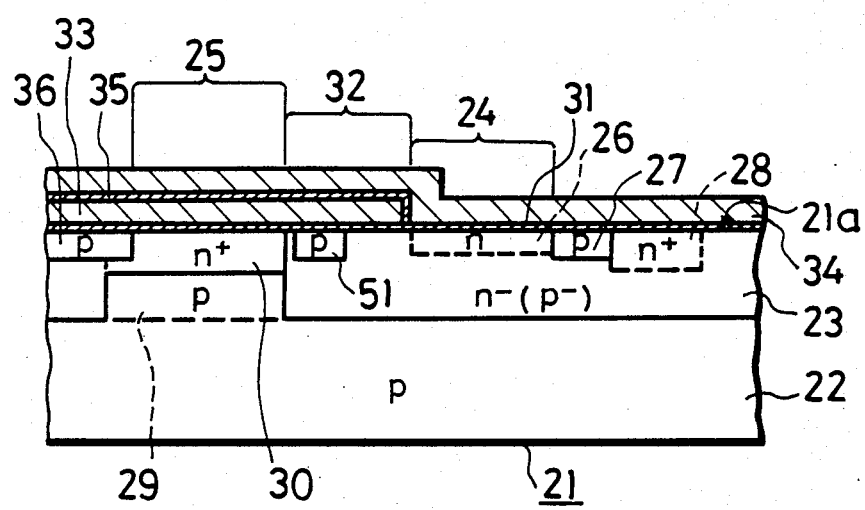
FIGS. 6 and 7 are respectively enlarged cross-sectional views showing main portions of other examples of the device according to the present invention.
Figure 7:
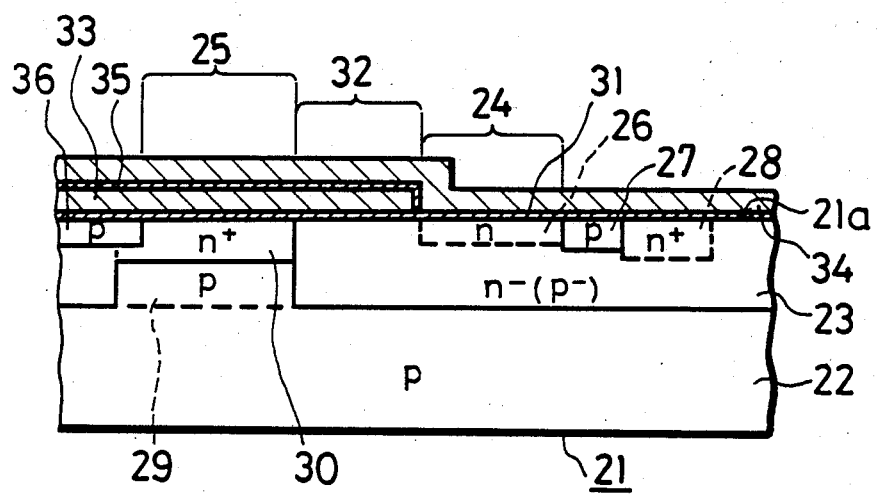

However, the well region 29, as shown in FIGS. 6 and 7, may be limitedly formed beneath the charge transfer region 30. In the case of FIG. 6, a region 51 is provided on the surface of the substrate 21 which serves as the barrier, or as shown in FIG. 7, only the barrier formed by the low impurity concentration region 23 is used.

The respective examples shown in the drawings are solid state imager devices in which the signal charge is the electron. On the contrary, when the signal charge is the hole, the conductivity types of the respective sections will be opposite to those shown in the drawings.

As described above, according to the present invention, since the light receiving section is formed as a buried channel type pinning MOS structure, the dark current can be reduced. Further, the low impurity region 23 is arranged under the light receiving area 26 to widen the depletion layer, so that the smear can be effectively suppressed.

In addition to these advantages, according to the present invention, since the light receiving area 26 has its edge coincident with the edge of the charge transfer control electrode 33 to prevent the area 26 from extending to the under part of the electrode 33, a defect such that when the voltage is applied to the electrode 33 to read out the signal charges, a potential valley is produced between the charge transfer region 30 and the light receiving area 26 which interferes the charge transfer will be avoided.

The above description is given on the preferred embodiment of the invention, but it will be apparent that many modifications and variations could be effected by one skilled in the art without departing from the spirit or scope of the novel concepts of the invention, so that the scope of the invention should de determined only by the appended claims.

I claim:

1. A solid state imager device comprising: a semiconductor substrate having a substrate region of a first conductivity type, a light receiving area of a second conductivity type forming a light receiving section, a charge transfer section which has a low impurity concentration region arranged under and in contact with said light receiving area and between said light receiving area and said substrate region;

a forward electrode formed on said semiconductor substrate over a dielectric layer; and a charge transfer control electrode formed on said dielectric layer and extending between said light receiving section and said charge transfer section, wherein said forward electrode is supplied with a voltage so as to form a charge storage layer in said light receiving area under said dielectric layer and said forward electrode, and an edge of said transfer control electrode substantially coinciding with an edge of said light receiving area at a side which faces said charge transfer section.

2. A solid state imager device as claimed in claim 1, wherein said charge transfer section is formed of a second conductivity type charge transfer region and a first conductivity type well region formed beneath said charge transfer region.

3. A solid state imager device as claimed in claim 2, wherein a part of said well region faces a surface of said semiconductor substrate between said charge transfer section and said light receiving section.

4. A solid state imager device as claimed in claim 2, wherein said well region is formed just beneath said charge transfer region.

5. A solid state imager device according to claim 4 further comprising a region of the first conductivity type which is formed on a surface of said semiconductor substrate between said charge transfer section and said light receiving section and serves as a barrier.

* * * * *